(12) United States Patent
Hopper et al.

(10) Patent No.: US 7,119,431 B1
(45) Date of Patent: Oct. 10, 2006

(54) APPARATUS AND METHOD FOR FORMING HEAT SINKS ON SILICON ON INSULATOR WAFERS

(75) Inventors: Peter J. Hopper, San Jose, CA (US); Iouri Mirgorodski, Sunnyvale, CA (US); Vladislav Vashchenko, Palo Alto, CA (US); Peter Johnson, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 54 days.

(21) Appl. No.: 10/665,897

(22) Filed: Sep. 18, 2003

(51) Int. Cl.
*H01L 23/34* (2006.01)
*H01L 27/12* (2006.01)

(52) U.S. Cl. .................. 257/706; 257/720; 257/347
(58) Field of Classification Search ................ 257/774, 257/347, 706
See application file for complete search history.

(56) References Cited

U.S. PATENT DOCUMENTS

| 4,175,152 A | * | 11/1979 | Carnahan et al. | ............ 442/110 |
| 6,081,037 A | * | 6/2000 | Lee et al. | .................... 257/778 |
| 6,483,147 B1 | * | 11/2002 | Lin | ............................. 257/347 |
| 2003/0057491 A1 | * | 3/2003 | Mitani et al. | ................ 257/347 |

OTHER PUBLICATIONS

Julian Blake, SIMOX (Separation by Implantation of Oxygen), Jul. 28, 2001, Encyclopedia of Physical Science and Technology.

* cited by examiner

*Primary Examiner*—Zandra V. Smith
*Assistant Examiner*—Kiesha Rose
(74) *Attorney, Agent, or Firm*—Beyer Weaver & Thomas, LLP

(57) ABSTRACT

An apparatus and method for a heat sink to dissipate the heat sourced by the encapsulated transistors in a SOI wafer. The apparatus includes a transistor formed in the active silicon layer of the wafer. The active surface is formed over an oxide layer and a bulk silicon layer. A heat sink is formed in the bulk silicon layer and configured to sink heat through the bulk silicon layer, to the back surface of the wafer. After the transistor is fabricated, the heat sink is formed by masking, patterning and etching the back surface of the wafer to form plugs in the bulk silicon layer. The plug extends through the thickness of the bulk layer to the oxide layer. Thereafter, the plug is filled with a thermally conductive material, such as a metal or DAG (thermally conductive paste). During operation, heat from the transistor is dissipated through the heat sink. In various embodiments of the invention, the plug hole is formed using either an anisotropic plasma or wet etch.

13 Claims, 5 Drawing Sheets

APPARATUS AND METHOD FOR FORMING HEAT SINKS ON SILICON ON INSULATOR WAFERS

FIELD OF THE INVENTION

The present invention relates generally to the fabrication of semiconductor devices, and more particularly, to an apparatus and method for forming heat sinks for silicon on insulator (SOI) type semiconductor wafers.

BACKGROUND OF THE INVENTION

For certain high speed and/or high powered integrated circuit applications, silicon on insulator (SOI) chips are desirable. SOI chips are typically fabricated from wafers that have a layer of oxide sandwiched between an active layer of silicon formed on the top surface of the wafer and a bulk layer of silicon formed on the bottom surface of the wafer. Transistors, electrical components, interconnect, and the like, are formed either within or on the active surface of the wafer. The bulk layer is provided to add mechanical strength or rigidity to the wafer.

SOI wafers can be formed using a number of well known techniques. According to one technique, a layer of oxide is grown over the surface of the bulk silicon layer. The active layer is then bonded over the oxide layer. In another method called SIMOX (Separation by Implantation of Oxygen), oxygen is implanted into the silicon at an energy level sufficient to form the oxide layer in the silicon wafer. For more information on this technique, see "SIMOX (Separation by Implantation of Oxygen", by Julian Blake, Encyclopedia of Physical Science and Technology, Jul. 28, 2001, incorporated by reference herein.

Generally speaking, CMOS transistors fabricated on SOI chips are used for high speed applications. Bipolar transistors on SOI chips are used for high power applications. In either case, trench like recess regions, filled with oxide, are formed around the four sides of each transistor. The oxide typically extends the entire depth of the active layer and contacts the oxide underlying layer formed over the bulk silicon layer. As a result, a complete isolation stricture is encapsulated around and underneath the transistor. Electrically isolated transistors can be placed closer to one another than transistors without the isolation. Consequently, the circuit density can be increased.

Heat dissipation is a significant problem with SOI chips. Oxide is a relatively poor heat conductor. High speed and/or high powered transistors tend to generate a great deal of heat during operation. Since the aforementioned transistors act as a heat source and are surrounded by insulation, (the oxide layer) the temperature of the active layer can significantly increase. In severe situations, the switching characteristics of the transistors may be adversely affected, causing the circuitry to not operate properly or fail.

An apparatus and method of providing a heat sink to dissipate the heat sourced by the encapsulated transistors of a SOI chip, is therefore needed.

SUMMARY OF THE INVENTION

To achieve the foregoing, and in accordance with the purpose of the present invention, an apparatus and method for a heat sink to dissipate the heat sourced by the encapsulated transistors in a SOI wafer is provided. The apparatus includes a transistor formed in the active silicon layer of the wafer. The active surface is formed over an oxide layer and a bulk silicon layer. A heat sink is formed in the bulk silicon layer and configured to sink heat through the bulk silicon layer, to the back surface of the wafer. After the transistor is fabricated, the heat sink is formed by masking, patterning and etching the back surface of the wafer to form plugs in the bulk silicon layer. The plug extends through the thickness of the bulk layer to the oxide layer. Thereafter, the plug is filled with a thermally conductive material, such as a metal or DAG (thermally conductive paste). During operation, heat from the transistor is dissipated through the heat sink. In various embodiments of the invention, the plug hole is formed using either anisotropic plasma or wet etch.

BRIEF DESCRIPTION OF THE DRAWINGS

The invention, together with further advantages thereof, may best be understood by reference to the following description taken in conjunction with the accompanying drawings in which.

In the Figures, like reference numbers refer to like components and elements.

DETAILED DESCRIPTION OF THE INVENTION

Figure 1:
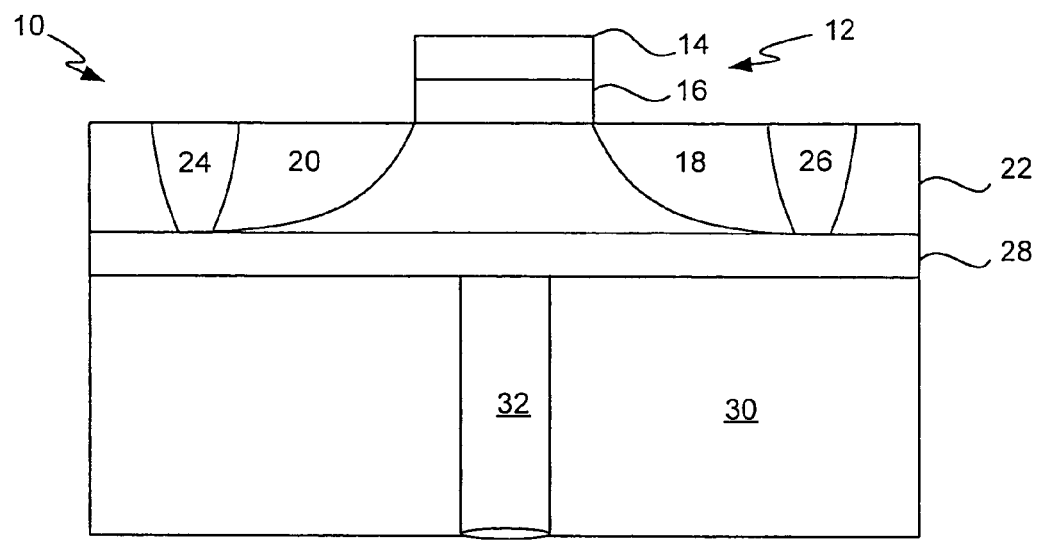
FIG. 1 is a cross section view of a MOS transistor on a SOI wafer having a heat sink according to one embodiment of the present invention.

Referring to FIG. 1, a cross section view of a MOS transistor on a SOI wafer is shown. The wafer 10 includes an MOS transistor 12 having a gate electrode 14, gate oxide 16, and source and drain regions 18 and 20 formed in an active silicon layer 22. Isolation regions 24 and 26, filled with a non-conductive material such as oxide, surround the source and drain regions 18, 20. The active layer 22 is formed over an oxide layer 28 and a bulk silicon layer 30. A heat sink 32, formed in the bulk silicon layer 30, extends from the oxide layer 28 to the bottom surface of the chip 10. In various embodiments of the invention, the heat sink 32 is a plug formed in the bulk silicon layer 30 that is filled with any of a variety of thermally conductive materials, such as copper, aluminum, gold, tungsten, DAG (Thermally conductive paste). In various embodiments of the invention, the heat sink has a circumference ranging from 0.002 mm to 5.0 mm.

The isolation regions 24 and 26 extend through the entire thickness of the active silicon layer 22 and contact the oxide layer 28. Together, the isolation regions 18, 20 and the oxide layer 28 form an isolation "well" that isolates the transistor 12 on all sides and underneath the transistor. With the transistor 12 electrically isolated from other components on the wafer 10, transistors can be placed closer to one another than otherwise possible without the isolation. Consequently, the circuit density can be increased. The fabrication of the SOI wafer 10 and the transistor 12 and the wells 24 and 26 are well known in the semiconductor art and therefore is not described in detail herein. However, according to various embodiments of the invention, the active layer 22 may range from 0.1 to 100 microns, the oxide layer 28 may range from 0.01 to 10 microns, and the bulk layer 30 may range from 50 to 10000 microns. It should be noted that these ranges are merely exemplary using current semiconductor wafer fabrication technology. In no way should these ranges be construed as limiting the present invention in any way. Larger layer thicknesses or smaller layer thicknesses may be used in the practice of the present invention. In particular, smaller dimensions may be possible in the future as processing technology improves and feature dimensions become smaller and smaller.

As transistor 12 switches during operation, it may generate a significant amount of heat, particularly in high speed and/or high power applications. Since oxide is generally a poor heat conductor, heat tends to be collect within the isolation well surrounding the transistor 12. The oxide layer 28 in particular becomes a heat source. The heat sink 32 conducts heat from the oxide layer 28 to the bottom surface of the wafer 10 so that the transistor 12 may operate at a lower temperature.

Figure 2:
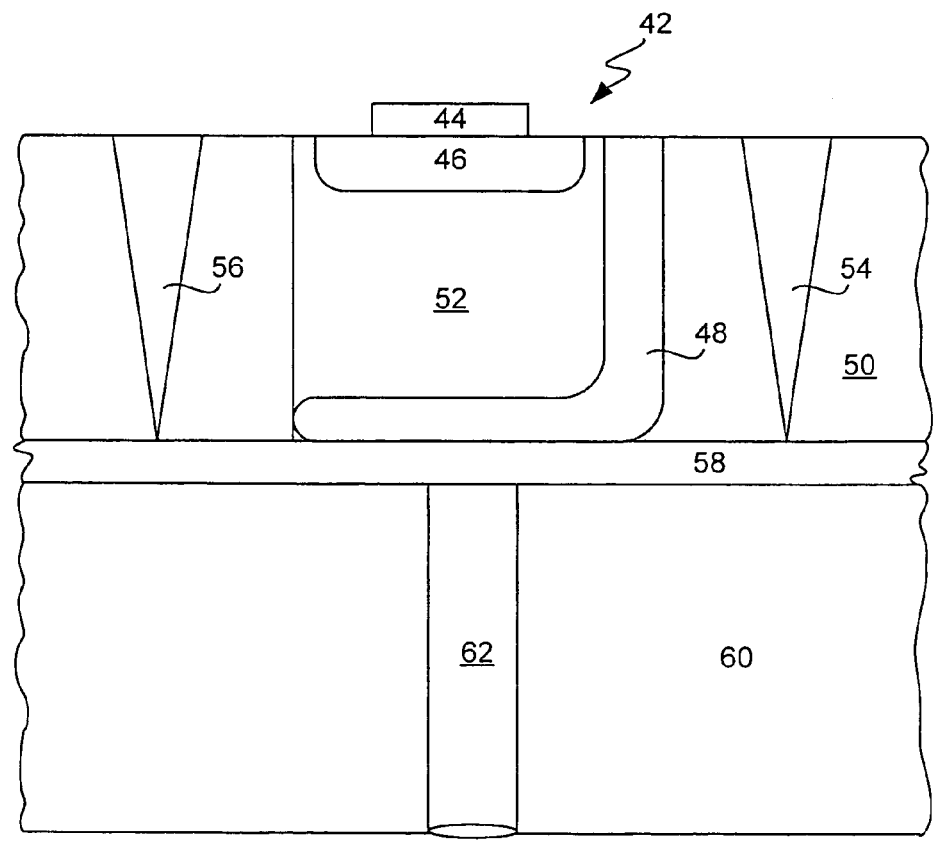
FIG. 2 is a cross section of a bipolar transistor on a SOI wafer having a heat sink according to another embodiment of the present invention.

Referring to FIG. 2, a cross section view of a bipolar transistor on a SOI wafer is shown. The wafer 40 includes a bipolar transistor 42 having an emitter 44, base 46, and collector 48 formed in an active silicon layer 50. A collector spacer region 52 is formed between the base 46 and the collector 48. Trench shaped isolation regions 54 and 56, filled with a non-conductive material such as oxide, surround the transistor 42. The active layer 50 is formed an oxide layer 58 and a bulk silicon layer 60. A heat sink 62, formed in the bulk silicon layer 60, extends from the oxide layer 58 to the bottom surface of the wafer 40. In various embodiments of the invention, the heat sink 62 is a plug formed in the bulk silicon layer 60 that is filled with any of a variety of thermally conductive materials, such as copper, aluminum, gold, tungsten, DAG (Thermally conductive paste). In various embodiments of the invention, the least sink has a circumference ranging from 0.2µ to 1 mm.

The isolation regions 54 and 56 extend through the entire thickness of the active silicon layer 50 and contact the oxide layer 58. Together, the isolation regions 54, 56 and the oxide layer 58 form an isolation "well" that electrically isolates the transistor 42 on all sides and underneath the transistor. With the transistor 42 electrically isolated from other components, it can be placed closer to other transistors on the wafer 40 than otherwise possible without the isolation. Consequently, the circuit density can be increased. The fabrication of the SOI wafer 40, the transistor 42 and the isolation regions 54 and 56 are well known in the semiconductor art and therefore are not described in detail herein. However, according to various embodiments of the invention, the active layer 50 may range from 0.1 to 100 microns, the oxide layer 58 may range from 0.1 to 10 microns, and the bulk layer 60 may range from 50 to 10000 microns. It should be noted that these ranges are merely exemplary. In no way should these ranges be construed as limiting the present invention in any way. Larger layer thicknesses or smaller layer thicknesses may be used in the practice of the present invention. In particular, smaller dimensions may be used in the future as processing technology improves and feature dimensions become smaller and smaller.

As transistor 42 switches during operation, it may generate significant amounts of heat, particularly in high speed and/or high power applications. Since oxide is generally a poor heat conductor, heat tends to be collect within the well surrounding the transistor 42. The oxide layer 58 in particular becomes a heat source under these conditions. The heat sink 62 conducts heat from the oxide layer 58 to the bottom surface of the chip 60 so that the transistor 42 can operate at a lower temperature.

FIGS. 3A–3F are a series of cross sections which illustrate the process steps to form a heat sink on a SOI wafer with MOS transistors according to one embodiment of the present invention. The process steps described below, however, are substantially the same with either MOS or bipolar transistors. Accordingly, although specific to MOS transistors, the detailed description provided below applies equally to bipolar transistors. It should be understood that the absence of a specific process flow for bipolar transistors should in no way be construed as limiting the invention.

Figure 3A:
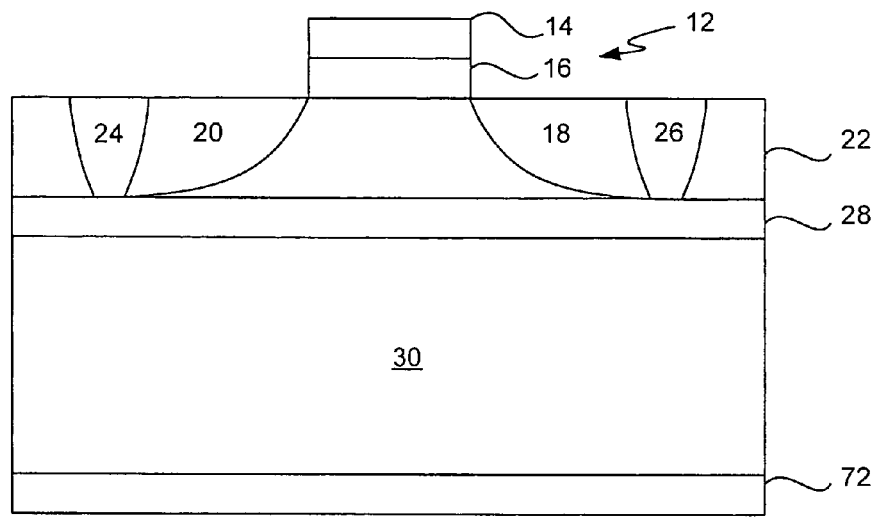
FIGS. 3A–3F are a series of cross sections which illustrate the process to form a heat sink on a SOI wafer according to one embodiment of the present invention.
Figure 3A:

Referring to FIG. 3A, a cross section of a wafer 70 is shown after the transistor 12 has been fabricated. As such, the gate 14 is formed over gate oxide 16 on the active surface of the wafer 70. The source and drain regions 18, 20 are formed within the active region 22 on the bulk region 30 of the wafer. The transistor 12 is surrounded by isolation regions 24, 26 and the oxide layer 28 as described above. A passivation layer 72 is typically formed on the bulk surface of the wafer 70 as a by product of the standard process steps used to fabricate the transistor 12 on the wafer 70.

Figure 3B:
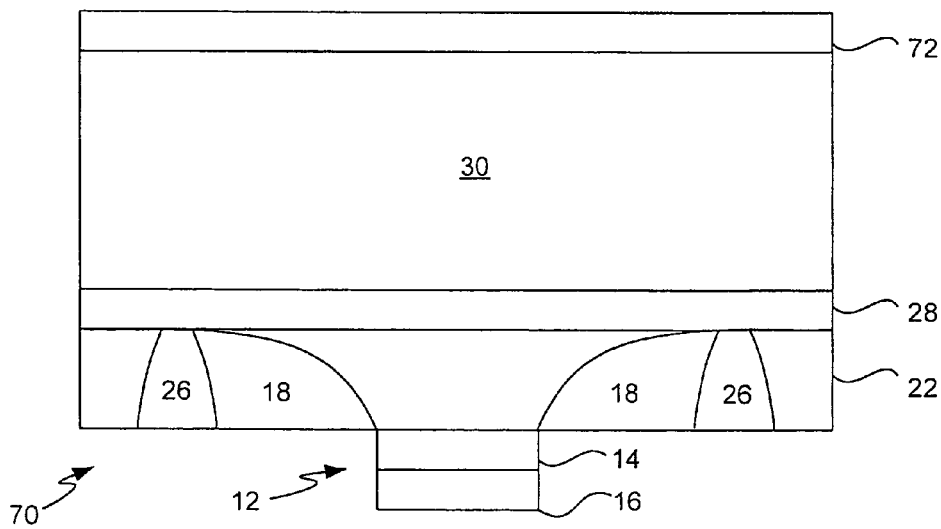
Figure 3C:
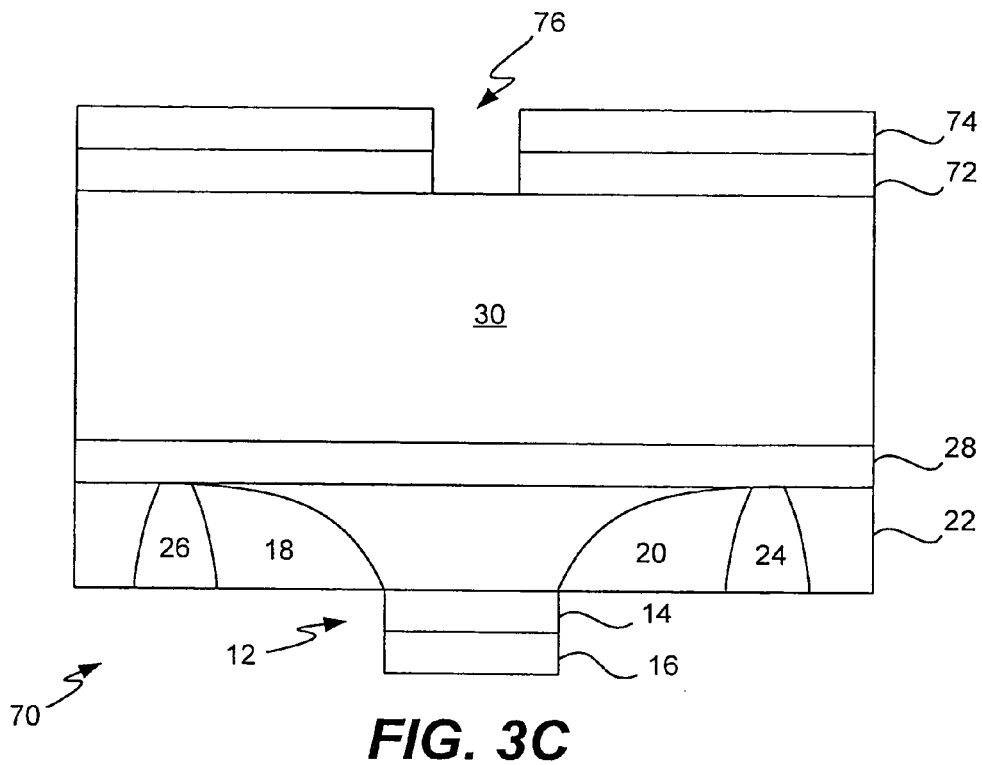
Figure 3D:
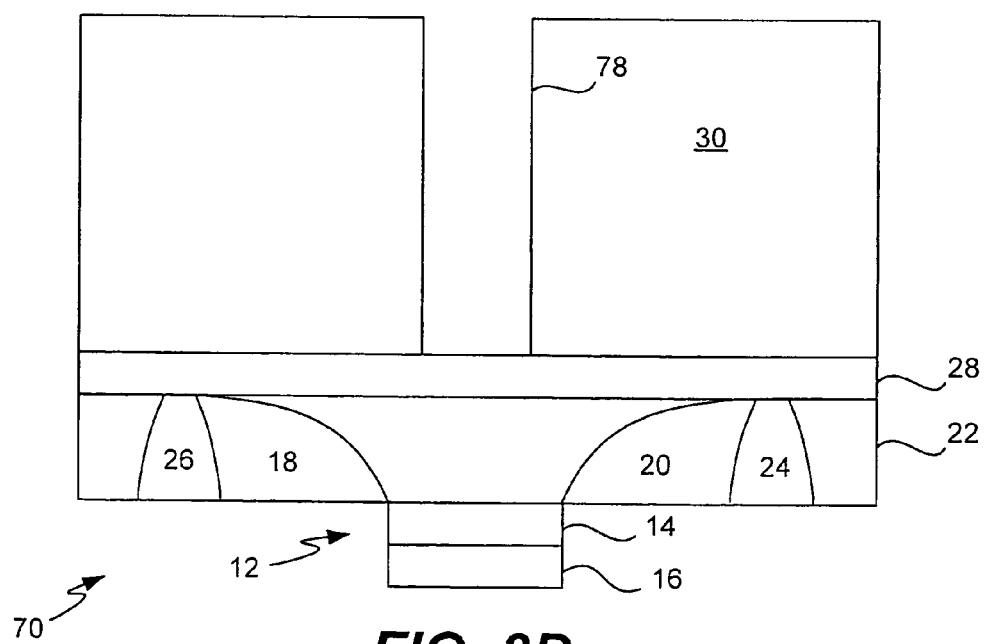
Figure 3E:
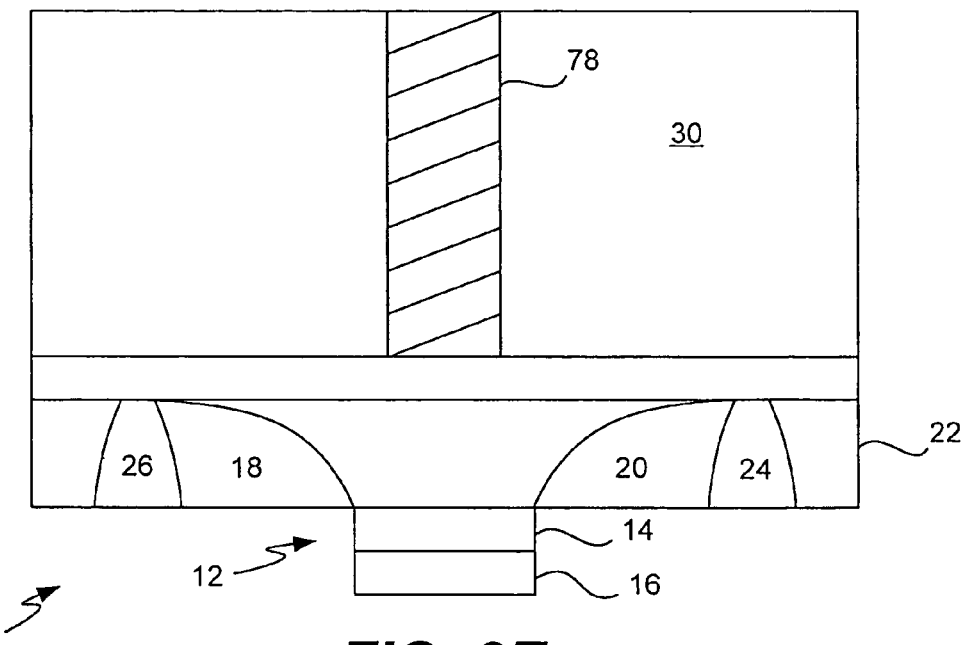
Figure 3F:
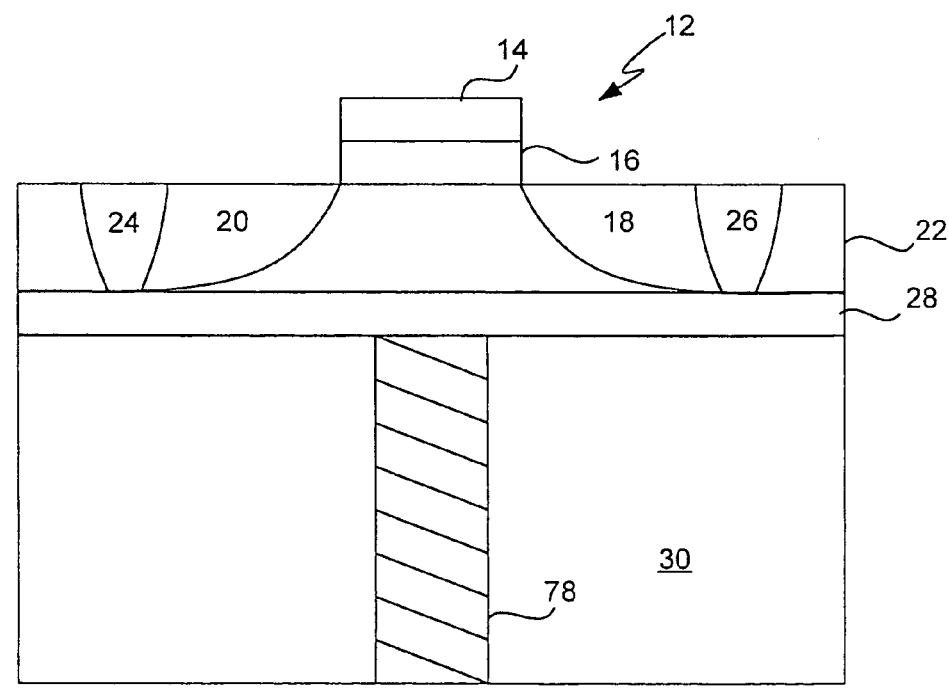

Referring to FIG. 3B, the wafer 70 is shown flipped upside down so that the passivation layer 72 on the bulk surface of the wafer is facing upward. In the initial fabrication step as illustrated in FIG. 3C, a mask layer 74 is formed over the passivation layer 72. The passivation layer 72 and the mask layer 74 are patterned to form an exposed region 76 which exposes the bulk silicon 30 in the location where a heat sink is eventually going to be formed. Referring to FIG. 3D, a plug 78 is etched into the bulk silicon layer 30. The oxide layer 28 acts as a stop during etching. The plug 78 extends through the thickness of the bulk layer 30 to the oxide layer 28. In a final processing step, the plug 78 is filled with a thermally conductive material such as such as copper, aluminum, gold, tungsten, DAG (thermally conductive paste) The plug filled with the thermally conductive material creates a heat sink which conducts heat away from the oxide layer 28. The resulting structure is illustrated in FIG. 3F, which shows the transistor 12 surrounded by isolation regions 24, 26 and oxide layer 28. Heat sink 78 extends from the oxide layer 28 through the bulk silicon layer 30 to the bottom surface of the wafer 70. Heat generated by the transistor 12 is conducted away from the oxide layer 28 to the bottom surface of the wafer through the heat sink 78.

Figure 4:
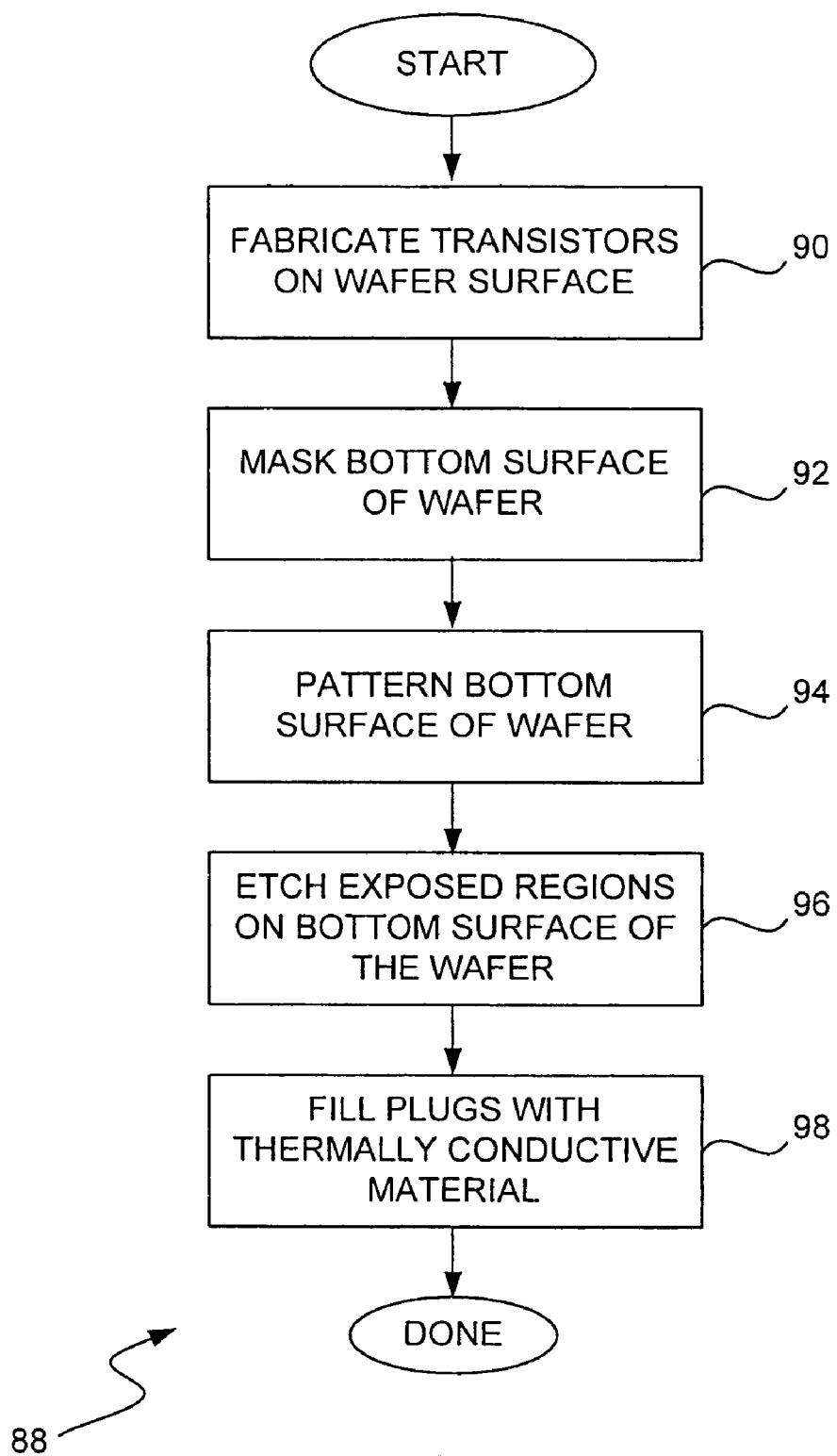
FIG. 4 is a flow chart describing the semiconductor fabrication steps to fom the heat sinks on an SOI wafer according to the present invention.

FIG. 4 is a flow chart 88 describing the semiconductor fabrication steps to form the heat sinks on an SOI wafer according to the present invention. Initially, transistors and other electrical components are fabricated on the active surface of the wafer (box 90). As previously noted, the transistors can be either MOS or bipolar. Once fabrication of the circuitry on the wafer has been substantially completed, the wafer is flipped and the bottom surface of the wafer is masked (box 92) and then patterned (box 94) to form a plurality of exposed regions 76 in the general location where heat sinks are to be formed. The back surface of the wafer is then etched (box 96) to form plugs that extend from the wafer surface through the bulk silicon layer to the oxide layer which acts as a etch stop. The plugs are then filled (box 98) with one of the aforementioned thermal conductors to form the heat sinks with in the SOI wafer.

According to various embodiments of the invention, the plugs can be formed using a standard anisotropic plasma etch. Generally, wafer orientations of 100 and 111 are typically used for MOS and bipolar transistor processes respectively. As is well known in the semiconductor fabrication art, anisotropic plasma etching can be used to form the plugs with substantially vertical side walls with either wafer orientation. In an alternative, lower cost, embodiment, an anisotropic etch can be achieved using an ethanol wet etch process (KOH+Ethanol) or TMAH. This embodiment, however, typically requires a wafer orientation of 110 which differs from what is commonly used with most semiconductor wafer processes. In situations where a wet etch is preferred, a bulk silicon layer 30 with the requisite 110 orientation can be achieved using a number of wafer manufacturing techniques. In one embodiment, an active silicon layer of any desired orientation (e.g., 100 or 111) may be bonded onto a bulk silicon layer having a 110 orientation. Alternatively, wafer with a 110 orientation may be made using the SIMOX method. With this embodiment, the bulk silicon layer has the proper 110 orientation. The active layer, however, would also have the same 110 orientation. Since wafers having a 110 orientation have a higher surface state density than 100 or 111 wafers, the performance of the circuitry fabricated on the chip may be slightly impacted.

After the transistors 12, 42 and heat sinks 32, 62 have been fabricated, the wafers 10, 48 are diced respectively. The result in each case are individual SOI die with heat sinks formed under individual transistors.

Although the foregoing invention has been described in some detail for purposes of clarity of understanding, it will be apparent that certain changes and modifications may be practiced within the scope of the appended claims. For example, the present invention could be used with BiCMOS processes. Therefore, the described embodiments should be taken as illustrative and not restrictive, and the invention should not be limited to the details given herein but should be defined by the following claims and their full scope of equivalents.

We claim:

1. An apparatus, comprising;
   an active semiconductor layer;
   a transistor formed in the active silicon layer;
   a bulk silicon layer having a first surface and a second surface;
   an oxide layer formed between the active silicon layer and the first surface of the bulk silicon layer; and
   a heat sink formed in the bulk silicon layer and configured to sink heat sourced through the oxide layer to the second surface of the bulk silicon layer, the heat sink being a thermally conductive material provided in the bulk silicon layer, the thermally conductive material being a thermally conductive paste.

2. The apparatus of claim 1, wherein the transistor is an MOS transistor.

3. The apparatus of claim 1, wherein the transistor is a bipolar transistor.

4. The apparatus of claim 1, further comprising isolation regions formed around the transistor in the active silicon layer and contacting the oxide layer formed between the active silicon layer and the first surface of the bulk silicon layer.

5. The apparatus of claim 1, wherein the heat sink is substantially plug shaped.

6. The apparatus of claim 5, wherein the plug has a length substantially the same as the thickness of the bulk silicon layer.

7. The apparatus of claim 5, wherein the plug has a circumference ranging from 1 to 50000 microns.

8. The apparatus of claim 1, further comprising
   a plurality of transistors formed in the active region, and
   a plurality of heat sinks associated with the plurality of transistors respectively, each of the plurality of heat sinks formed in the bulk silicon layer configured to sink heat sourced in the oxide layer to the second surface of the bulk silicon layer, each of the heat sinks being plugged shaped and filled with the thermally conductive paste.

9. The apparatus of claim 7, wherein the plurality of transistors and the plurality of heat sinks are formed on a semiconductor die.

10. The apparatus of claim 8, wherein the plurality of transistors and the plurality of heat sinks are formed on a semiconductor wafer.

11. The apparatus of claim 1, wherein the bulk silicon layer is formed in a semiconductor material having one of the following orientations: 100, 111, or 110.

12. The apparatus of claim 1, wherein the active silicon layer is formed in a semiconductor material having one of the following orientations: 100, 111, or 110.

13. The apparatus of claim 1, wherein the thermally conductive paste is DAG.

* * * * *

UNITED STATES PATENT AND TRADEMARK OFFICE
CERTIFICATE OF CORRECTION

| | | |
|---|---|---|
| PATENT NO. | : 7,119,431 B1 | Page 1 of 1 |
| APPLICATION NO. | : 10/665897 | |
| DATED | : October 10, 2006 | |
| INVENTOR(S) | : Hopper et al. | |

It is certified that error appears in the above-identified patent and that said Letters Patent is hereby corrected as shown below:

In the Specification:

Column 1, line 42, change "stricture" to --structure--.

Column 2, line 30, change "to fom" to --to form--.

In the Claims:

(Column 6, line 30) change "claim 7" to --to claim 8--.

Signed and Sealed this

Twelfth Day of June, 2007

JON W. DUDAS
*Director of the United States Patent and Trademark Office*